(12) United States Patent
Oglesbee

(10) Patent No.: US 6,316,956 B1
(45) Date of Patent: Nov. 13, 2001

(54) MULTIPLE REDUNDANT RELIABILITY ENHANCEMENT METHOD FOR INTEGRATED CIRCUITS AND TRANSISTORS

(75) Inventor: John Wendell Oglesbee, Watkinsville, GA (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/527,039

(22) Filed: Mar. 16, 2000

Related U.S. Application Data

(60) Provisional application No. 60/161,133, filed on Oct. 22, 1999.

(51) Int. Cl.[7] ............................................. H03K 19/003
(52) U.S. Cl. .......................... 326/10; 326/13; 326/14; 326/82; 326/83; 323/225; 323/272
(58) Field of Search ................................ 326/9, 10, 11, 326/13, 14, 82, 83; 257/341, 342, 339; 323/225, 272; 363/50–53, 55, 56

(56) References Cited

U.S. PATENT DOCUMENTS

| | | | |
|---|---|---|---|
| 5,283,762 | * | 2/1994 | Fujishima ........................ 365/189.09 |
| 5,881,076 | * | 3/1999 | Murray ................................. 371/49.1 |
| 6,084,434 | * | 7/2000 | Keeth ...................................... 326/87 |
| 6,114,895 | * | 9/2000 | Stephens ............................... 327/391 |
| 6,118,310 | * | 9/2000 | Esch, Jr. ................................. 327/108 |

OTHER PUBLICATIONS

Mark N. Hornstein, Microelectronic Circuits & Devices, 1990 by Prentice_Hall, Inc., p. 753, 1990.*

* cited by examiner

Primary Examiner—Michael Tokar
Assistant Examiner—Vibol Tan
(74) Attorney, Agent, or Firm—Philip H. Burrus, IV

(57) ABSTRACT

In a fault-tolerant integrated power circuit, a plurality of power transistors, each having a power source electrically coupled to a common source line, a power gate and a power drain electrically coupled to a common drain line, is capable of driving a power current from the source line to the drain line. A first plurality of control transistors, each having a first source, a first gate and a first drain, is disposed so that the first drain of each of the first plurality of control transistors is electrically coupled to a corresponding power gate of a different one of the power transistors. A first transistor control circuit generates a first control signal that is electrically coupled to each first gate of the first plurality of control transistors. At least a second plurality of control transistors, each having a second source, a second gate and a second drain, is disposed so that the second drain of each of the second plurality of control transistors is electrically coupled to a corresponding power gate of a different one of the power transistors. A second transistor control circuit generates a second control signal that is electrically coupled to each second gate of the second plurality of control transistors. A plurality of current sources, each current source being electrically coupled to a different power gate of the plurality of power transistors, draws current in a predetermined direction relative the power gate.

9 Claims, 4 Drawing Sheets

MULTIPLE REDUNDANT RELIABILITY ENHANCEMENT METHOD FOR INTEGRATED CIRCUITS AND TRANSISTORS

CROSS REFERENCE TO RELATED APPLICATIONS

This application claims priority from U.S. Provisional Patent Application Ser. No. 60/161,133 filed Oct. 22, 1999, entitled MULTIPLE REDUNDANT RELIABILITY ENHANCEMENT METHOD FOR INTEGRATED CIRCUITS AND TRANSISTORS, naming John Wendell Oglesbee as inventor. This application is incorporated herein by reference in its entirety and for all purposes.

The disclosure that follows is further enabled by U.S. patent application Ser. No. 60/073,279 which is also hereby incorporated by reference in its entirety and for all purposes.

TECHNICAL FIELD OF THE INVENTION

The present invention relates to silicon protection circuits and, more specifically, to a protection circuit for a voltage regulator for a rechargeable battery.

BACKGROUND OF THE INVENTION

The notion of redundancy is well known as a safety means. A primary example is military aircraft, where redundant systems are prevalent. If the primary electrical system fails, there is another to take its place. If the primary fuel distribution system fails, there is another to take its place. The theory being that the probability of two systems failing simultaneously is far less than the probability of a single system failing.

Automotive breaking systems provide an example of redundant systems in the consumer market. Many cars today actually have dual braking systems. The redundant systems run from the same master cylinder to save cost, but utilize two distinct control systems to stop the wheels. If either system fails, the other takes over so that the car may be stopped safely.

Likewise, in the electronics industry, engineers and designers building protection circuits for safety applications have used redundant components and circuits for improved safety reliability. In such a redundant system, if a defect occurs in a particular protection circuit, a redundant circuit may still provide the required level of safety protection. As stated, the probability that two redundant circuits will fail simultaneously is much smaller than the probability that a single defect may occur in a single circuit. Thus, redundant circuits provide additional safety and security in safety protection circuits.

An example of an electronic component employing redundant technology is the Metal Oxide Silicon Field Effect Transistor (MOSFET). MOSFETs come in many shapes and sizes, depending upon the power that the MOSFET is designed to handle. Generally speaking, the larger the transistor, the more power that can be dissipated. Large transistors capable of handling more that 1 watt of power dissipation are colloquially known as "power transistors".

A common misconception with power transistors is the idea that they are simply large. People often think of a 1 watt transistor as having physical characteristics twice that of a ½ watt transistor. In reality, this is not so. Due to lower manufacturing costs, in a MOSFET cell matrix structure, the power MOSFET is actually manufactured as numerous (thousands is typical) transistors connected in parallel by metalization runners on the integrated circuit silicon. The effect of these numerous transistor cells operating in parallel is to achieve a high current handling capability. Each cell of the structure shares a tiny amount of the total current.

An example of this structure is shown in FIG. 1. This structure employs a plurality of MOSFET transistors 8 (although only four are shown, it will be understood that many transistors are typically employed), each connected to a common drain 2, a common source 6 and a common gate 4. Thus, if the common gate 4 is asserted, current will flow from the drain 2 to the source 6 (or vice versa, depending on whether n-channel or p-channel MOSFET's are used), with only a fraction of the total current flowing through each individual MOSFET 8.

The redundant transistor system works well on silicon because the tiny transistors are inexpensive to manufacture. When an application engineer builds products like rechargeable batteries, however, he must design in duplicate parts to achieve redundancy. For example, if a rechargeable battery designer uses a transistor as a voltage regulator, to achieve redundancy he must use two discrete transistors. Each transistor occupies its own package. While this type of redundancy is effective, it is expensive. It also requires more circuit board space to realize a safe circuit.

There is therefore a need for an improved semiconductor safety device.

DETAILED DESCRIPTION OF THE INVENTION

Figure 1:
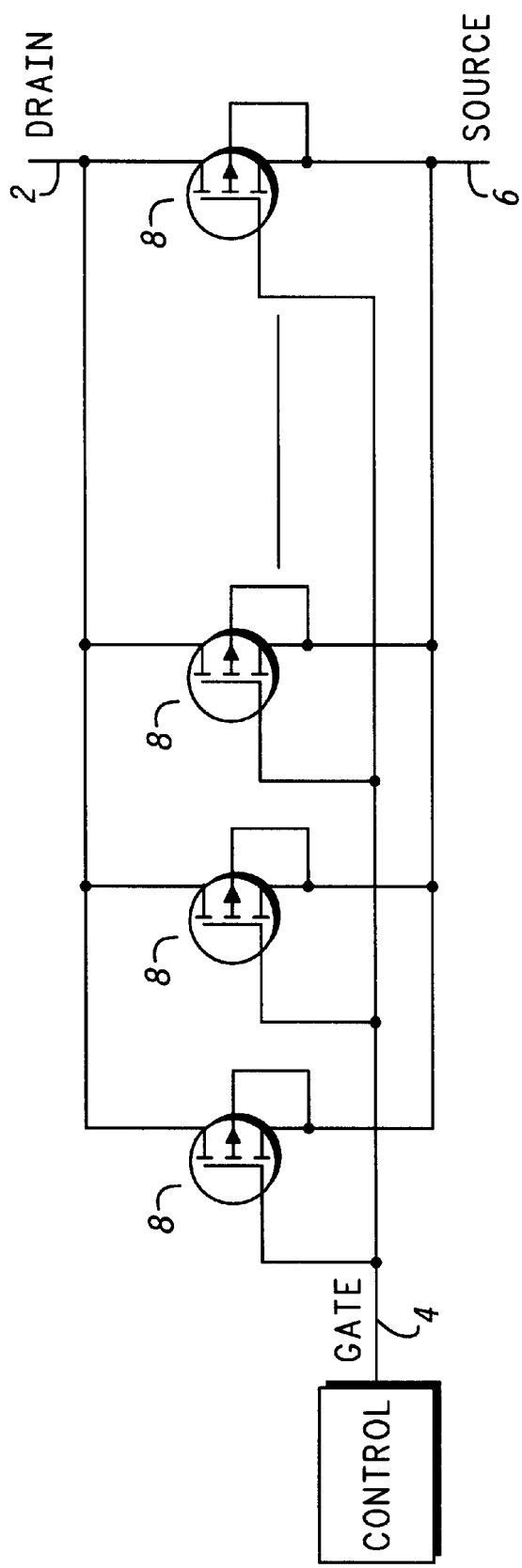
FIG. 1 is a schematic diagram of a prior art circuit.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 2:
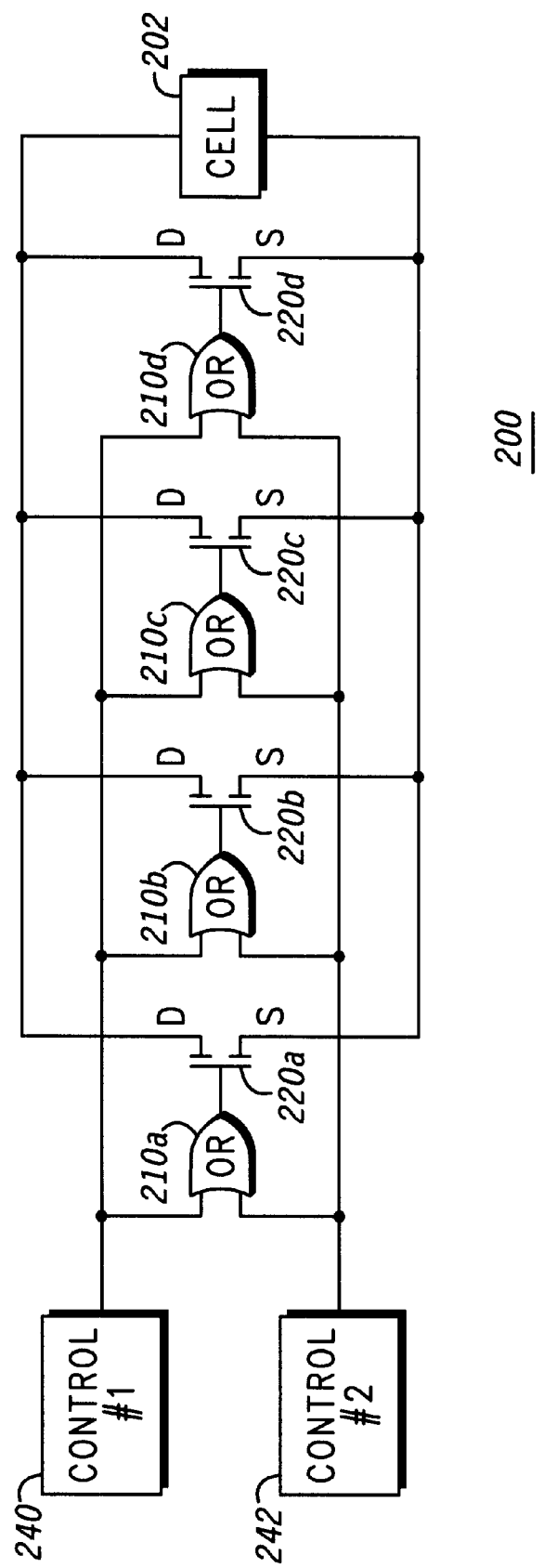
FIG. 2 is a schematic diagram of a circuit in accordance with one embodiment of the invention.

As shown in FIG. 2, one general illustrative embodiment of the invention is a fault-tolerant integrated power circuit 200 in which two control circuits 240 and 242, spaced apart on an integrated circuit, drive a plurality of power control gates 210*a–d* (which could be OR gates, or NAND gates if reverse logic is employed. Each power control gate 210*a–d* drives a different power transistor 220*a–d*. Each power transistor 220*a–d* provides over voltage protection to a load 202, such as a rechargeable battery. The power control gates 210*a–d* are capable of driving their corresponding power transistor 220*a–d* even if one of the control circuits 240 or 242 fails, or if one of the inputs to the power control gates 210*a–d* develops a fault. (While only four power control gates and power transistors are shown in this embodiment for the sake of simplicity, it will be readily understood by those of skill in the art that many more control gates and power transistors could be employed in a typical commercial embodiment.)

While the embodiment of FIG. 2 could employ digital OR gates as the power control gates 210a–d, it could also use analog OR gates, which act as linear regulators. As used herein, an analog OR gate is one that is driven by the dominant input of two inputs. Thus, in this embodiment, the analog OR gates would not require digital signal levels as inputs, but would be responsive to the control circuit 240 or 242 that had the stronger signal level.

Figure 3:
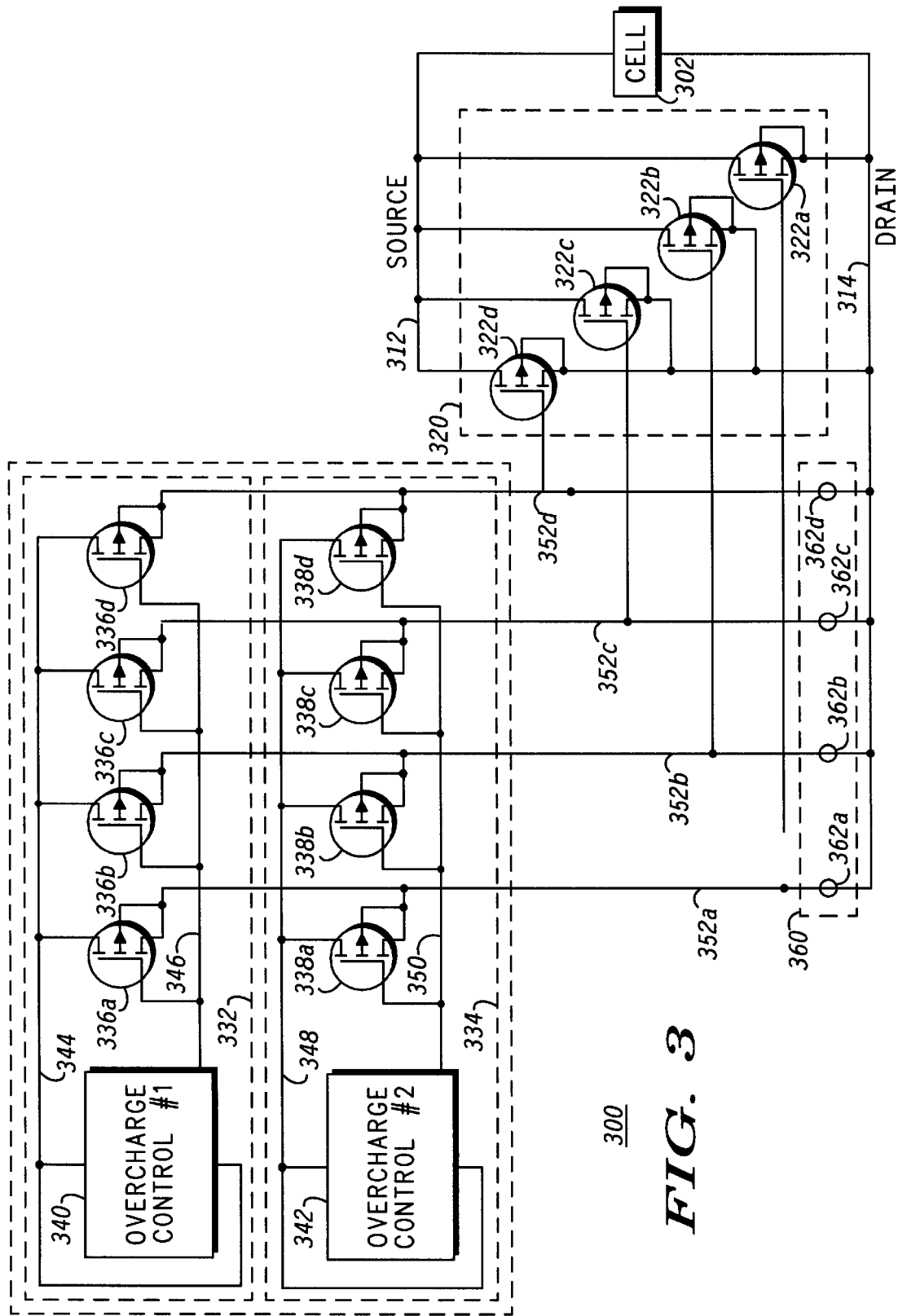
FIG. 3 is a schematic diagram of an integrated circuit layout in accordance with one embodiment of the invention.

As shown in FIG. 3, one specific illustrative embodiment of the invention is a fault-tolerant integrated power circuit 300, such as one that may be employed in a battery cell protection device, that includes a power transistor unit 320, a first control unit 332 and a second control unit 334. The power transistor unit 320 includes a plurality of power transistors 322a–d disposed on a single integrated circuit chip (although only four transistors 322a–d are shown for the sake of simplicity, it is understood that many power transistors may be employed without departing from the scope of the invention). Each power transistor 322a–d has a power source electrically coupled to a common source line 312, a power gate 352a–d and a power drain electrically coupled to a common drain line 314. The plurality of power transistors is capable of driving a power current from the source line 312 to the drain line 314.

The first control unit 332 includes a first plurality of control transistors 336a–d (again, only four transistors are show for the sake of simplicity), disposed on the single integrated circuit chip. Each of the first plurality of control transistors 336a–d has a first source 344, a first gate and a first drain. The first drain of each of the first plurality of control transistors 336a–d is electrically coupled to a corresponding power gate 352a–d of a different one of the power transistors 322a–d (e.g., the first drain of control transistor 336a is coupled to the gate 352a of power transistor 322a, the first drain of control transistor 336b is coupled to the gate 352b of power transistor 322b, etc.). The first control unit 332 also includes a first transistor control circuit 340 that is disposed on the single integrated circuit chip. The first transistor control circuit 340 generates a first control signal 346 that is electrically coupled to each first gate of the first plurality of control transistors 336a–d.

The second control unit 334 includes at least a second plurality of control transistors 338a–d disposed on the single integrated circuit chip and spaced apart from the first plurality of control transistors 336a–d. Each of the second plurality of control transistors 338a–d has a second source 348, a second gate and a second drain. The second drain of each of the second plurality of control transistors 338a–d is electrically coupled to a corresponding power gate 352a–d of a different one of the power transistors 322a–d. Thus, if either one of the control transistors driving the gate of a corresponding power transistor fails, the other control transistor will continue driving the power transistor. For example, if control transistor 336c were to fail open, then control transistor 338c would continue driving gate 352c of power transistor 322c. A second transistor control circuit 342, which is disposed on the single integrated circuit chip and spaced apart from the first transistor control circuit 340, generates a second control signal 350. The second control signal 350 is electrically coupled to each second gate of the second plurality of control transistors 338a–c.

A plurality 360 of current sources 362a–d, each electrically coupled to a different power gate 352a–d of the plurality of power transistors 322a–d draws current in a predetermined direction relative each power gate 352a–d.

As would be readily understood by those of skill in the art, each transistor described above could be a metal oxide semiconductor field effect transistor (MOSFET), or other type of field effect transistor, depending on the application and the type of substrate used. In certain applications, non-field effect transistors could be employed without departing from the scope of the invention. While the above-described embodiments of the invention employ n-channel field effect transistors, it will be readily understood that embodiments employing other semiconductor technologies (e.g., p-channel transistors, bipolar junction transistors, etc.) fall well within the scope of the invention.

Figure 4:
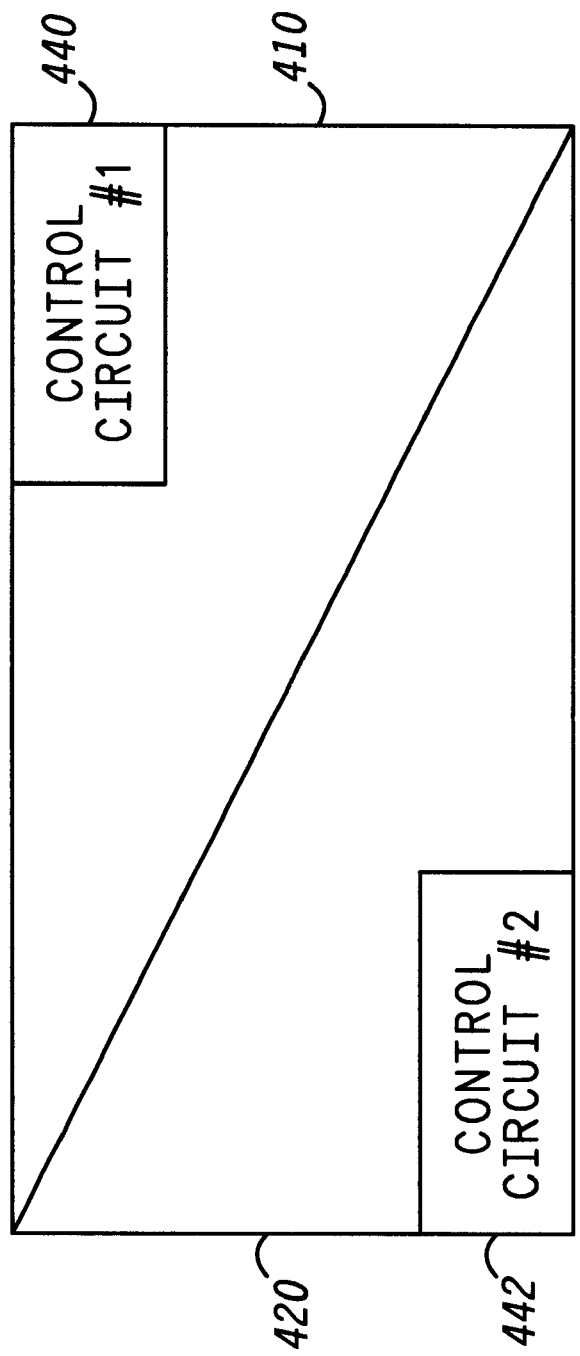
FIG. 4 is a block diagram of an integrated circuit layout in accordance with one embodiment the invention.

The control circuits 340, 342 shown above could be as simple as a gate pin on a power transistor or as complex as a microcontroller. In one embodiment, the control circuitry comprises thermal sensing and over voltage control circuitry for protection in battery circuits. In one embodiment, as shown in FIG. 4, the invention is manufactured on a single integrated circuit chip 400 having a first half 410 and second half 420. The first control circuit 440 and the first plurality of control transistors are disposed on the first half 410 and the second control circuit 442 the second plurality of control transistors are disposed on the second half 420. The reason for this separation is that silicon failures generally occur in localized regions of an integrated circuit. Failures involving large area or broad regions of the die are much less probable. By physically and electrically separating the control circuits, if one control circuit should become disabled, there is a high probability that the other control circuit would survive.

For a complete understanding of the benefits of this invention, the concept of a failsafe design strategy is important. As mentioned, one illustrative application for this invention is as a shunt regulator for a battery as shown in FIG. 3. With reference to this application, and analyzing the circuit from a safety protection viewpoint, only those failure modes that might result in a loss of safety protection need to be considered with respect to providing a redundant protection strategy. In other words, while there are many failure modes, only those that might compromise the operation of the battery need to be accounted for. Others become moot in this application. Thus, redundancy is only required for safety protection circuits with respect to failure modes which could occur that might result in an unsafe circuit operation.

For example, an open circuit in the cell charging current path is a failsafe failure mode. The cell cannot be overcharged if the charging current path is open. Redundancy for this type of failure mode is therefore not required. However, a short circuit across a series switching device intended to disconnect the cell during overcharge conditions would result in an inability to interrupt the overcharge condition. This second example is not a failsafe failure mode, and some form of redundant switch function would be desired to provide additional security and reliability against this form of failure.

The following failure modes are failsafe and do not require redundancy: (1) A drain to source short in any transistor element bypasses all charging current through that element, and is failsafe. In a possible secondary failure, excess charging current through one tiny single element may cause it short further is still failsafe, or it may cause it to fuse open; (2) An open drain or open source circuit in any element prevents that element from passing any current. However, if only a few of the huge number of elements fail open in this manner, the overall effect is insignificant. The remainder of the elements still function in a redundant manner, and are still able to bypass any excess charging current; (3) A gate to drain short in any transistor element enhances the gate voltage of all elements within the parallel structure and forces all transistors of the structure to conduct. This bypasses any excess charging current and is failsafe. The following failure mode is not failsafe: a gate to source short in any element of the structure could pull the gate voltage of all transistors to zero. This would shut off all the transistors in the structure, and no charge current could be bypassed by any of the transistors.

An important aspect of this invention is a failsafe design concept that provides redundancy only for those failure modes in which the failures are not failsafe. This simplifies the requirements of providing redundant protection, and results in a less complex and less costly protection device solution. To accomplish this goal, the elements of the transistor are divided into several groups of elements. If the gate circuits of each group of transistor elements are driven independently, then a failure of any gate element in any one group may be prevented from propagating to the gate circuits of the remaining groups. If a gate to source short occurs in one group of elements, the remaining groups remain functional and provide a redundant path to bypass charging current. The remaining groups therefore provide full redundancy for the group of elements containing the failure. There are numerous methods of designing gate circuitry such that a failure in one gate circuit does not affect the remaining groups of elements. For example, a simple resistor in series with each group of gates may prove satisfactory. The resistors limit the gate current to any failed group of elements, and therefore allow the remaining groups of transistor elements to be driven successfully. Many other variations of suitable gate drive circuits will occur to those skilled in the art of integrated circuit design.

Regardless of the actual gate circuitry, invention isolates the gates into groups such that a gate to source short circuit failure in one group of transistor elements does not affect the successful operation of the remaining groups of transistor elements. In this manner, the groups of transistors provide multiple levels of safety redundancy for each other. In the form of integrated circuit silicon, the area required to add the required gate drives is not significant; therefore many groups can be practically isolated from each other for the purpose of redundancy.

Another feature of the invention is a fully redundant control circuit. If one control circuit should become disabled in any way, the second control circuit is still able, operating through the matrix of gate driver transistors, to control the power transistors to bypass all excessive charging current. The control circuit, in this example of a cell protection device, contains such functions as a voltage reference to measure the cell voltage, a comparator to determine if the cell voltage exceeds safe limits, and drive outputs to the matrix of gate circuits that turn on the output power transistors to bypass excessive charging current as needed. In terms of silicon area, a fully redundant complete control circuit consumes only a small part of the active silicon area, and therefore can be added with very little cost impact to the total device.

Operation of the redundant control circuit and matrix of gate drivers is structured by the design of the elements such that if any failure occurs in any particular circuit element, the remaining functional circuit elements dominate operation in a manner to increase the output current in the power transistors. This is the failsafe mode of dominate operation which is useful in a battery protection device. The exact details of the control circuit design may take many forms depending on the specific integrated circuitry involved in the protection device. However, it is understood by those skilled in the art of integrated circuit design how the control circuits and matrix of gate drive circuits can be designed to accomplish the desired failsafe features of operation for each application.

If a single control transistor (338c, for example) should fail in an essential function, e.g. it fails due to any single failure (gate shorts to drain, gate shorts to source, drain shorts to source, gate open, drain open, source open, etc., known as Failure Mode and Effects Analysis (FMEA) type failures), the corresponding redundant control transistor (336b, in this case) takes over and keeps it's power component functioning correctly. If any control transistor should become shorted, the power dissipation of that transistor is limited by the current sources 362a–d. This avoids excessive heating in the silicon which could cause a thermal failure to propagate to other areas of the silicon that might otherwise still be functional.

An essential feature of the circuit configuration is, that for cell protection charge current bypass applications, the circuit is fully redundant or failsafe so that if a single failure occurs at any point in the circuit, the remainder of the circuit can still operate to protect a connected cell from any potential overcharge damage.

Redundancy and failsafe performance of the invention can be demonstrated by considering the failure modes that could occur, and the effect each such failure would have on the cell overcharge protection operation. For this purpose, a method of Failure Mode and Effects Analysis (FMEA) that is widely accepted in the art of circuit design, is to consider all possibilities for signals to be "stuck high" or "stuck low" and for all signal paths and adjacent circuit points to be either "open" or "shorted."

In making an FMEA analysis for the circuit of this invention, it must be noted that any failure mode that causes current to flow through one or more of the power transistors is considered failsafe. Thus, if any failure mode occurs such that current is bypassed away from the cell by one or more of the power transistors, then excessive charging current is bypassed by that failure mode, and therefore that failure mode cannot result in an overcharge situation for the cell being protected.

With reference now to the circuit, the several potential failure modes are considered now as follows:

If a drain to source short occurs in any one of the power transistors, that transistor will bypass current away from the cell, and the cell is thereby protected from overcharge.

If an open drain or an open source connection occurs in any one of the power transistors, that transistor can no longer bypass current. However, the remaining transistors are still fully functional in their ability to bypass current and protect from overcharge.

If an open gate occurs in any transistor, then that transistor may either turn on or turn off. It the transistor turns on, then that transistor will bypass current away from the cell, and the cell is thereby protected from overcharge. If the transistor turns off, then the remaining transistors are still fully functional in their ability to bypass current and protect from overcharge.

If a gate to drain short occurs in any of the transistors, then that transistor is turned on and will bypass current away from the cell, and the cell is thereby protected from overcharge.

If a gate to source short occurs on any one of the transistors, then that transistor cannot be turned on. However, the remaining transistors are still fully functional in their ability to bypass current and protect from overcharge. To further assure this, the "OR" circuitry must be designed such that all inputs to the "OR" circuitry are not affected by the state of the output of the "OR" circuitry, even if the "OR" circuitry output is forced into the wrong state by a failure of the gate connected to the output, or a short of the output to either a "high" or "low" logic state. This may be accomplished using methods known in the art by careful design of the "OR" circuitry.

If any output of any "OR" circuitry is stuck "high" then the corresponding transistor is turned on, and that transistor will bypass current away from the cell, and the cell is thereby protected from overcharge.

If any output of any "OR" circuitry is stuck "low" then the corresponding transistor is turned off. However, the remaining transistors are still fully functional in their ability to bypass current and protect from overcharge.

If any input to any "OR" circuitry is stuck either "high" or "low" then that input is defective. In the case of any stuck "high" input the output of that "OR" circuitry will turn on the corresponding transistor, and that transistor will bypass current away from the cell, and the cell is thereby protected from overcharge. If any input is stuck "low" then that input is not functional. However, the remaining "OR" circuits and transistors are still fully functional in their ability to bypass current and protect from overcharge.

If the output of either overcharge detector circuit is stuck "high" then all transistors are turned on through their corresponding "OR" circuitry. Current is bypassed away from the cell, and the cell is thereby protected from overcharge.

If the output of either overcharge detector circuit is stuck "low" then the "OR" circuitry operates such that the alternative second overcharge detector output is fully functional in turning on the transistors. The ability to bypass charging current away from the cell is retained, thereby protecting the cell from overcharge.

If either overcharge detector is defective and not functional in any manner, then the alternate detector is still able to operate through the "OR" circuitry to turn on the transistors. Current is bypassed away from the cell, and the cell is thereby protected from overcharge.

The nature of the invention and the redundancy of the circuits are such that a single point failure at any point in any portion of the circuit will not result in failure of the overcharge protection features of the circuit. In this manner, the circuitry of the invention is failsafe and fault tolerant in preventing overcharge of the cell.

Although one embodiment of the invention readily applies itself to battery protection circuits, the invention is applicable to any power semiconductor device, including power transistors, shunt regulators, series regulators, overload protection devices for power supplies and the like.

The above-described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:

1. A fault-tolerant integrated power circuit, comprising:
   a. a plurality of power transistors, each having a power source, each power source electrically coupled to a common source line, a power gate and a power drain, each power drain electrically coupled to a common drain line, the plurality of power transistors capable of driving a power current from the source line to the drain line;
   b. a first plurality of control transistors, each of the first plurality of control transistors having a first source, a first gate and a first drain, the first drain of each of the first plurality of control transistors being electrically coupled to a corresponding power gate of a different one of the power transistors;
   c. a first transistor control circuit that generates a first control signal, the first control signal being electrically coupled to each first gate of the first plurality of control transistors;
   d. at least a second plurality of control transistors each of the second plurality of control transistors having a second source, a second gate and a second drain, the second drain of each of the second plurality of control transistors being electrically coupled to a corresponding power gate of a different one of the power transistors;
   e. a second transistor control circuit that generates a second control signal, the second control signal being electrically coupled to each second gate of the second plurality of control transistors; and
   f. a plurality of current sources, each current source being electrically coupled to a different power gate of the plurality of power transistors so as to draw current in a predetermined direction relative the power gate; wherein the first transistor control circuit is spaced apart from the second transistor control circuit on the integrated circuit chip.

2. The fault-tolerant integrated power circuit of claim 1, wherein the first plurality of control transistors is spaced apart from the second plurality of control transistors on the integrated circuit chip.

3. The fault-tolerant integrated power circuit of claim 1, implemented on a single integrated circuit chip, wherein the first plurality of control transistors is spaced apart from the second plurality of control transistors on the integrated circuit chip.

4. The fault-tolerant integrated power circuit of claim 3, wherein the first transistor control circuit is spaced apart from the second transistor control circuit on the integrated circuit chip.

5. The fault-tolerant integrated power circuit of claim 1, wherein each transistor comprises a field effect transistor.

6. The fault-tolerant integrated power circuit of claim 5, wherein each field effect transistor is a metal oxide semiconductor field effect transistor.

7. A fault-tolerant integrated power circuit, comprising:
   a. a plurality of power transistors, disposed on a single integrated circuit chip, each having a power source, each power source electrically coupled to a common source line, a power gate and a power drain, each power drain electrically coupled to a common drain line, the plurality of power transistors capable of driving a power current from the source line to the drain line;
   b. a first plurality of control transistors, disposed on the single integrated circuit chip, each of the first plurality of control transistors having a first source, a first gate and a first drain, the first drain of each of the first plurality of control transistors being electrically coupled to a corresponding power gate of a different one of the power transistors;
   c. a first transistor control circuit, disposed on the single integrated circuit chip, that generates a first control signal, the first control signal being electrically coupled to each first gate of the first plurality of control transistors;
   d. at least a second plurality of control transistors, disposed on the single integrated circuit chip and spaced apart from the first plurality of control transistors, each of the second plurality of control transistors having a second source, a second gate and a second drain, the second drain of each of the second plurality of control transistors being electrically coupled to a corresponding power gate of a different one of the power transistors;

e. a second transistor control circuit, disposed on the single integrated circuit chip and spaced apart from the first transistor control circuit, that generates a second control signal, the second control signal being electrically coupled to each second gate of the second plurality of control transistors; and f. a plurality of current sources, each current source being electrically coupled to a different power gate of the plurality of power transistors so as to draw current in a predetermined direction relative the power gate;

wherein the first transistor control circuit is spaced apart tom the second transistor control circuit on the integrated circuit chip.

8. The fault-tolerant integrated power circuit of claim 7, wherein each transistor comprises a field effect transistor.

9. The fault-tolerant integrated power circuit of claim 8, wherein each field effect transistor is a metal oxide semiconductor field effect transistor.

* * * * *